United States Patent
Tomita et al.

[11] Patent Number: 5,959,329
[45] Date of Patent: Sep. 28, 1999

[54] INSULATING OXIDE FILM FORMED BY HIGH-TEMPERATURE WET OXIDATION

[75] Inventors: Hiroshi Tomita, Yokohama; Mamoru Takahashi, Kawasaki; Yoshio Ozawa, Yokohama, all of Japan

[73] Assignee: Kabushiki Kaisha Toshiba, Kawasaki, Japan

[21] Appl. No.: 08/718,197

[22] Filed: Sep. 19, 1996

[30] Foreign Application Priority Data

Mar. 18, 1995 [JP] Japan .................................. 8-061140
Sep. 19, 1995 [JP] Japan .................................. 7-240003

[51] Int. Cl.⁶ .................................................. H01L 29/788
[52] U.S. Cl. .......................... 257/321; 257/405; 257/411; 257/629; 257/645
[58] Field of Search .................................. 257/321, 629, 257/645, 405, 411

[56] References Cited

U.S. PATENT DOCUMENTS 5,122,847  6/1992  Kamiya et al. ........................ 257/321

FOREIGN PATENT DOCUMENTS 1 292864  11/1989  Japan .
3 20088  1/1991  Japan .

OTHER PUBLICATIONS

Yoshio Murakami, et al., "Effect of Oxidation Ambient on the Dielectric Breakdown Characteristics of Thermal Oxide Films of Silicon", J. Appl. Phys., vol. 75, No. 10, pp. 5302–5305, May 15, 1994.

Extended Abstracts of the 1995 International Conference on Solid State Devices and Materials, pp. 264–266, 1995, Hideki Satake, et al., "Reliability of Structurally Modified Ultra–Thin Gate Oxides".

*Primary Examiner*—Carl Whitehead, Jr.
*Attorney, Agent, or Firm*—Oblon, Spivak, McClelland, Maier & Neustadt, P.C.

[57] ABSTRACT

The present invention provides an insulating film formed on a surface of a substrate and made of a material containing oxygen, wherein a charge correction is carried out at a 1s peak position of a carbon adsorbed on a surface of the insulating film, and relative amounts between first to fourth peaks obtained when an oxygen 1s peak of the insulating film is decomposed by a same half width of 1.208 eV into a first peak at the oxygen 1s peak site obtained from an α-quartz crystal charge corrected similarly, and second to fourth peaks at positions of +0.87 eV, −0.35 eV and −0.83 eV, respectively from the oxygen 1s peak position, have relationship of that the third peak is higher than the second and fourth peaks, and the first peak is higher than the third peak, when a portion about 1 nm thick from the surface of the substrate of the insulating film is analyzed by a photo-electronic spectral method for an photoelectron extracting angle of 15° or less.

20 Claims, 8 Drawing Sheets

INSULATING OXIDE FILM FORMED BY HIGH-TEMPERATURE WET OXIDATION

BACKGROUND OF THE INVENTION

1. Field of the Invention

The present invention relates to an insulating film used as a tunnel oxide film of a flash memory, a gate oxide film of a transistor or the like, and to a method of forming such a film.

2. Description of the Related Art

Apart from the memory for general use, such as DRAM, SRAM or the like, recently there has been an increasing demand of EEPROM (flash memory), in which data remains if the power is turned off, data can be rewritten for $10^6$ times or more, and which is suitable for a large increase in capacity. The reliably of such a flash memory is deeply correlated with the reliability of the silicon oxide film (insulating film) having a thickness of 10 nm or less, which is called a tunnel oxide film. Thus, the reliability of the flash memory is greatly influenced by three different electrical characteristics: (1) dielectric breakdown life, (2) charge trap amount and (3) stress leak amount, which are items of evaluating the reliability of a silicon oxide film. If at least one of these characteristics is deteriorated, the device cannot function sufficiently.

As described above, it is necessary for a flash memory to keep up the above three reliabilities at the same time; however, with a conventional thermal oxide film, all of the reliabilities cannot be satisfied. For example, as to the conventional thermal oxide film, there has been a report of achieving the prolongation of the dielectric breakdown life and the reduction of the charge trap amount; however, there has been no report of achieving a significant reduction in the stress leak amount.

Further, in the case of the gate oxide film of a transistor, for example, the variance of the element characteristics occurs due to hot carrier implantation. The hot carrier implantation is a phenomenon in which electrons in a channel of a transistor becomes hot as energy being supplied from an electric field in the direction along the channel, and the electrons are implanted into the gate oxide film. This phenomenon generates a charge trap in an oxide film, or an interface state at an interface between the oxide film and the substrates, which causes a variation in the threshold value of the transistor or a gm deterioration.

Meanwhile, with regard to the method of forming a tunnel oxide film, in the case where an oxide film having a thickness of about 5 to 10 nm is formed by a conventional vertical diffusion furnace, it has been reported that an oxied film, which was oxidized in a water vapor atmosphere, in a so-called wet oxidizing atmosphere, has an insulation breakage life longer than an oxide film, which was oxidized at a temperature of 850°, in a so-called dry oxidizing atmosphere (dry oxidizing atmosphere). Further, with regard to the amount of stress leak generated, it has been reported that the amount of the stress leak of an oxide film formed in a water vapor oxidizing atmosphere is suppressed more (lower) than the case of an oxide film formed in a dry oxygen atmosphere. Meanwhile, it has been reported that the density of the charge trap is reduced more in an oxide film formed in a dry oxygen atmosphere than in an oxide film formed in a water vapor atmosphere. However, there has been no report on a silicon thermal oxide film or a method of forming such a film, which satisfies all of the above-described three reliabilities at the same time.

As described, with a silicon thermal oxide film, by itself, it is not possible to satisfy the three reliabilities at the same time, and therefore a silicon oxynitride film in which nitrogen is introduced into a silicon thermal oxide film, is presently used as a tunnel oxide film. The silicon oxynitride film is able to decrease the stress leak amount, and further satisfies the conditions of a dielectric breakage life which the silicon thermal oxide film itself possesses and a decrease in the charge trap amount. Thus, the silicon oxynitride film satisfies the above-described reliabilities at the same time.

However, the silicon oxynitride film has current-voltage (I-V) characteristics different from those of a silicon oxide film which does not contain nitrogen, since nitrogen is introduced to a silicon thermal oxide film. Also, the device operation characteristics are varied along with the amount of nitrogen introduced, which creates a problem. As typically exemplified in the thinning of a thermal oxide film at an element separation edge, the three reliabilities are very much influenced by the reliability of the silicon thermal oxide film itself, which serves as an underlayer. In reality, it is necessary to improve the film quality of the silicon thermal oxide film must be further improved in terms of all of the three reliabilities, from those of the present status.

SUMMARY OF THE INVENTION

The present invention has been proposed in consideration of the above-described drawback of the prior art technique, and the object thereof is to provide an insulating film having a long dielectric breakage life, capable of reducing the amount of the interface state and the amount of charge trap generated, and capable of remarkably reducing the amount of stress leak generated when a high electrical field stress is applied, as well as a method of manufacturing such a film.

According to an aspect of the present invention, there is provided an insulating film formed on a surface of a substrate and made of a material containing oxygen, wherein a charge correction is carried out at a 1s peak position of a carbon adsorbed on a surface of said insulating film, and relative amounts between first to fourth peaks obtained when an oxygen 1s peak of said insulating film is decomposed by a same half width of 1.208 eV into a first peak at the oxygen 1s peak position obtained from an α-quartz crystal charge corrected similarly, and second to fourth peaks at positions of +0.87 eV, −0.35 eV and −0.83 eV, respectively from the oxygen 1s first peak position, have relationship of that the third peak is higher than the second and fourth peaks, and the first peak is higher than the third peak, when a portion about 1 nm thick from the surface of the substrate of the insulating film is analyzed by a photoelectronic spectral method for an photoelectron extracting angle of 15° or less. With this structure, it becomes possible to form an insulating film having excellent electrical characteristics, even if the thickness thereof is only 3 nm or more and 10 nm or less.

With regard to the insulating film of the present invention, the insulating film made of a material containing oxygen, is meant to be a silicon oxide film, silicon oxynitride film or the like.

Further, with the insulating film of the present invention, the portion about 1 nm thick (deep) from the surface of the substrate is analyzed by a photoelectronic spectral method while setting the photoelectron extracting angle at 15° or less. This is because the difference from a conventional insulating film can be observed only in a region very close to the surface of the substrate, as the matter of the sensitivity of the analysis. Therefore, for example, at a section 10 nm-deep from the surface of the substrate, a fine difference between the insulating film of the present invention and a conventional one cannot be observed due to a low sensitivity of the analyzing device. Further, the reason why the photoelectron extracting angle is set at 15° or less in the photoelectronic spectral method, is to analyze the insulating film mainly. When the angle exceeds 15°, for example, when the angle is 90°, the amount of photoelectrons from the substrate increases, and therefore the sensitivity for analyzing the insulating film is relatively decreased.

In the insulating film of the present invention, it is preferable that the relative amount of the first peak should be 40% or more of an area of the oxygen 1s peak, the relative amount of the third peak should be 30% or less of the area of the oxygen 1s peak, and the relative amounts of the second and fourth peaks should be 20% or less of the area of the oxygen 1s peak. This is because if the relative amount of the first peak is less than 40% of the area of the oxygen 1s peak, the reliability of the insulating film is decreased, making a film structure having the same characteristics as those of an insulating film obtained by the conventional method.

According to another aspect of the present invention, there is provided a method of forming an insulating film on a surface of a substrate, comprising the steps of heating the substrate in a processing chamber an atmosphere inside which is a water vapor atmosphere maintained at 900° C. or higher; and carrying the substrate from the processing chamber into an inert gas atmosphere, cooling down the substrate at a maximum temperature decreasing rate of 15° C./sec or more to cool the substrate to a temperature of 600° C., and forming an insulating film or a surface of said substrate.

According to the present invention, there is further provided a method of forming an insulating film on a surface of a substrate, comprising the steps of introducing water vapor into a processing chamber in a state of maintaining a substrate at a particular temperature of 100° C. to 600° C. within the processing chamber; heating said substrate at a particular temperature of 900° C. or more at a maximum temperature increasing rate of 25° C./sec or more; cooling said substrate to a temperature of 600° C. or less at a maximum temperature decreasing rate of 15° C./sec or more; and forming an insulating film on a surface of said substrate. In this method, it is preferable that the atmosphere consisting of the diluting gas is created in the processing chamber before the temperatures of the processing chamber reaches a set temperature range of a thermal processing temperature, and when the temperatures reach the set temperature range, water vapor should be introduced to the processing chamber along with the diluting gas, thus creating a diluted water vapor atmosphere.

In the method of the present invention, it is preferable that the water vapor should be diluted with an insert gas, in order to form a thin insulating film by a high-temperature reaction. With this operation, an insulating film having a thickness of 10 nm or less can be formed in a short period of time even at a high temperature of 1100° C. Further, the dilution should preferably be 1 to 50% in consideration of the processing time for the single wafer process.

It was found that in order to form an insulating film of the present invention by above-mentioned method, there are four important conditions for the formation of a film, that is, the oxide gas atmosphere, the oxidizing temperature for the substrate, the temperature increasing rate and the temperature decreasing rate.

More specifically, in the film forming method of the present invention, the atmosphere in which the substrate is placed is set at about 900° C. or higher. This is because if the temperature is lower than about 900° C., the amount of stress leak, in particular, is increased, of the three electrical characteristics. Further, the maximum temperature decreasing rate while cooling the substrate down to about 600° C. is set about 15° C./sec or more. This is because if the maximum temperature decreasing rate is lower than about 15° C./sec, the amount of stress leak and the dielectric breakage life, in particular, are deteriorated, of the three electrical characteristics. The maximum temperature increasing rate while heating the substrate up to about 900° C. is set about 25° C./sec or more. This is because if the maximum temperature increasing rate is lower than about 25° C./sec, the thickness of an oxide film (low temperature oxide film) formed at a low temperature of 900° C. or less while increasing the temperature, is increased, and as a result, the thickness of an oxide film (high temperature oxide film) formed at a high temperature effectively, is decreased.

In the present invention, as the substrate, a silicon substrate (monocrystal silicon substrate, polysilicon substrate, amorphous silicon substrate) or a substrate having a film made of a silicon material (a monocrystal silicon, polysilicon or amorphous silicon) on the surface thereof, in particular, SOI (silicon on insulator) substrate, and an epitaxial silicon substrate or the like can be used. The insulating film means a gate insulating film, at tunnel insulating film between a substrate and a floating gate, a insulating film at the gate bird's beak region, and the like. It should be noted that the insulating film of the present invention includes an insulating film for electron conduction, for a conduction band, and an insulating film for hole conduction of a valence band.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The inventors of the present invention intensively studied the film forming conditions required for satisfying the three electrical characteristics of an insulating film, namely, a long dielectric breakage life, a small charge trap amount and a small stress leak amount, at the same time, and analyzed the structural variation of a formed insulating film in its film thickness direction by an X-ray photoemission spectroscopy (XPS).

For example, with use of a silicon thermal oxide film as an insulating film, the state of the oxide film at oxygen 1s peak (O1s) was analyzed. It was found from the result of the analysis that the bonding state of oxygen changed from the interface between the substrate and the insulating film (the surface of the substrate) towards the film thickness direction. Particularly, in the region of the insulating film, which is within 1 nm in thickness from the interface, the structure of the insulating film was largely different from that of the conventional type. Thus, it was further found that the above-described electrical characteristics greatly depended on the difference of the film structure in this region.

Figure 1A:
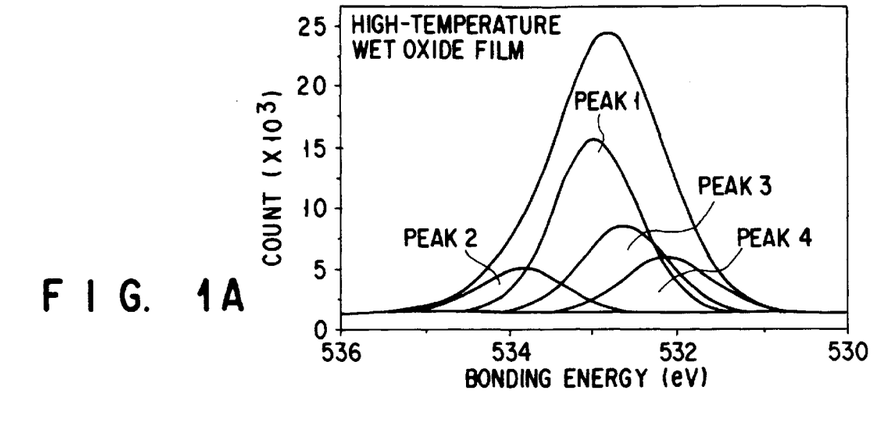
FIG. 1A is a diagram showing an oxygen 1s spectrum of a section 1-nm thick from the substrate of the oxide film formed by a high-temperature wet step, obtained by an XPS analysis.
Figure 1B:
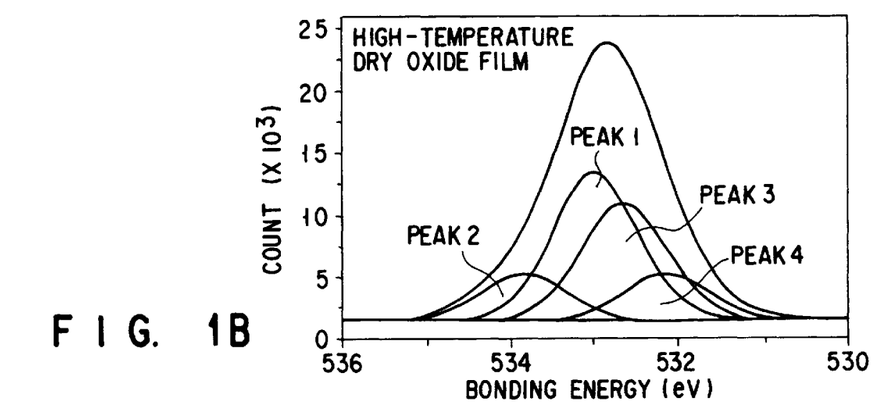
FIG. 1B is a diagram showing an oxygen 1s spectrum of a section 1-nm thick from the substrate of the oxide film formed by a dry step, obtained by an XPS analysis.

FIG. 1A is a diagram showing an O1s spectrum of a portion of an oxide film (a high-temperature wet oxide film), which is located at 1 nm in thickness from the substrate surface, by an XPS measurement, the oxide film being formed by a high-temperature wet method according to the present invention. FIG. 1B is a diagram showing an O1s spectrum of a portion of an oxide film (a dry oxide film), which is located at 1 nm in thickness from the substrate surface, by the XPS measurement, the oxide film being formed by a conventional dry method. It should be noted that the bonding energy values in the above cases were obtained by recalculation with respect to the carbon 1s peak set at 285 eV.

As is clear from FIGS. 1A and 1B, in both of the high-temperature wet oxide film of the present invention and the conventional dry oxide film, from the analysis of the peak (peak 2) at 533.8 eV, which is the second peak, the peak (peak 1) at 532.9 eV, which is the first peak, the peak (peak 3) at 532.6 eV, which is the third peak, the peak (peak 4) at 532.1 eV, which is the fourth peak, all having the same half width of 1.208 eV, with the separation of oxygen 1s peak, it can be understood that the structure of oxygen bonding is different from one case to the other.

It was found from the results of the research conducted by the inventors of the present invention that the insulating film of the present invention, which satisfies the relationship: peak 1>peak 3>peak 2 or peak 4, between relative amounts of the peak components, has a reliability higher than that of the conventional insulating film. It was further found that the relative amount of the first peak should preferably be 40% or more of the oxygen 1s peak area, the relative amount of the third peak should preferably be 30% or less of the oxygen 1s peak area, and the relative amounts of the second or fourth peaks should preferably be 20% or more of the oxygen 1s peak area.

For example, according to one structure of the high-temperature wet oxide film according to the present invention, the peak 1 is 47% of the oxygen 1s peak, the peak 3 is 24% of the oxygen 1s peak, the peak 2 is 13% of the oxygen 1s peak, and the peak 4 is 16% of the oxygen 1s peak. In contrast, according to one structure of the dry oxide film according to the conventional technique, the peak 1 is 41% of the oxygen 1s peak, the peak 3 is 32% of the oxygen 1s peak, the peak 2 is 13% of the oxygen 1s peak, and the peak 4 is 14% of the oxygen 1s peak. It should be noted that the reason why, particularly, the region within 1 nm in thickness from the surface of the substrate was considered is that, a significant difference in structure between the insulating film of the present invention and the conventional insulating film was not observed by the XPS, in a region out of the above range, for example, at a section which is located at 4 nm in thickness from the substrate surface.

It is considered that the peak 1 component has an amorphous structure in which the bonding angle of Si—O—Si is 144°, which is the same as the case of α-quartz, and the peak 3 component has an amorphous structure in which the bonding angle is 165°, which is the same as the case of cristobalite. These peaks overlap with those obtained when quartz crystal and cristobalite crystal, and therefore it is considered that a similar component of the bonding angle is present in a peak of the insulating film shown in the figure. Consequently, the high-temperature wet oxide film has a less distorted structure, whereas the high-temperature dry oxide film has a much distorted structure which contains a great amount of the cristobalite component. From this fact also, it can be understood that the high-temperature wet oxide film is more stable and has a better quality than the dry oxide film. Further, though it is not shown in the figure, the low-temperature dry oxide film formed at 750° C. exhibits film composition ratios of 52% at the peak 1, 13% at the peak 2, 15% at the peak 3 and 20% at the peak 4, and has a distorted structure which contains components of bonding angles other than the above 144° and 165°.

Figure 2:
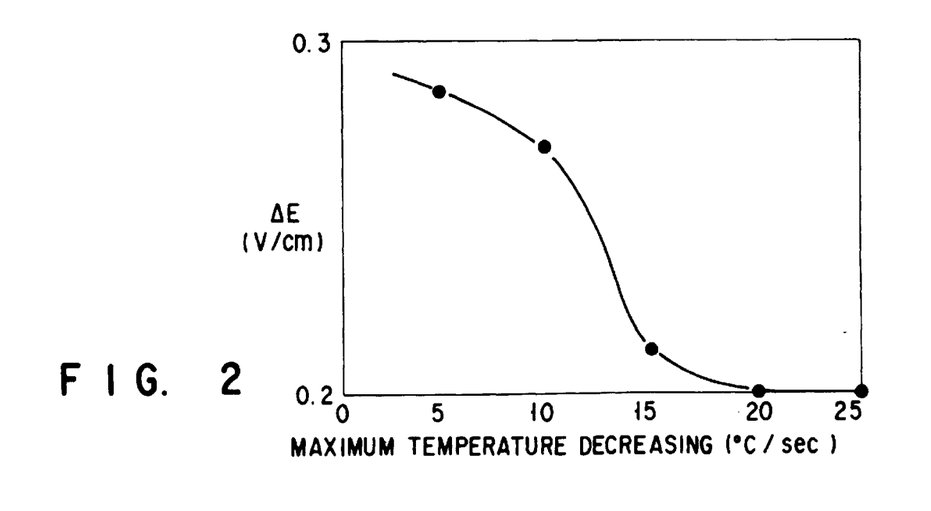
FIG. 2 is a characteristic diagram illustrating a change in the stress leak amount ($\Delta E$) with respect to the highest temperature drop rate.

The main feature of the forming method of the present invention is that the substrate is cooled down to 600° C. at a maximum temperature decreasing rate of 15° C. or more. The quality of an insulating film formed is greatly influenced by the temperature decreasing rate. As an example, capacitors having a thickness of 7.5 nm were manufactured in the following manner. That is, the oxidizing temperature at which the substrates were thermally oxidized was set at 900° C., and the substrates were cooled at various maximum temperature decreasing rates. As to each of the capacitors thus obtained, the amount of stress leak (ΔE) was obtained. The stress leak amount is a value of a low-electrical field leak current amount obtained when measuring the J-E (IV) characteristics before and after a high electrical field constant current stress (implantation in a change amount of $2C/cm^2$ at a current density of $-100$ $mA/cm^2$ for 20 seconds) was applied to the oxide film, which was expressed on the basis of the amount of shift (ΔE:V/cm) of the electrical field which generates a current density of $1\times10^{-7} A/cm^2$. Thus, an influence of the maximum temperature decreasing rate on the reliability of the oxide film was examined, and the results were summarized in FIG. 2. As can be seen from FIG. 2, the stress amount increases rapidly when the maximum temperature decreasing rate is lower than 15° C./sec. It is considered that this is because an oxide film (low-temperature oxide film) is formed in the vicinity of the interface between the substrate and the oxide film while cooling down at a low temperature decreasing rate, thus deteriorating the quality of the film.

The case where the present invention is applied to a thermal oxide film forming process for a silicon substrate will now be described.

Figure 3:
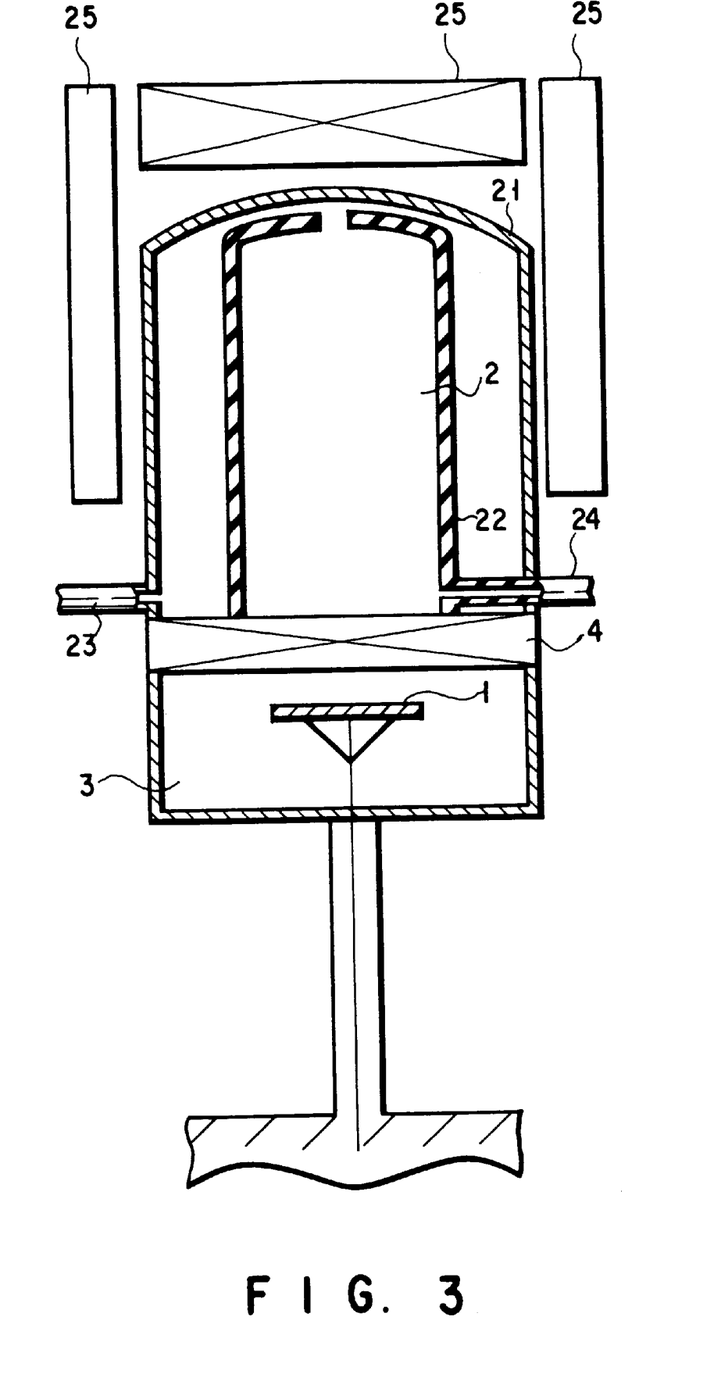
FIG. 3 is a schematic diagram showing a heat processing apparatus used in the forming method of the present invention.

In this embodiment, water vapor was used as oxide gas species, and in order to improve the uniformity of the oxide film thickness within a substrate surface portion at an oxidizing temperature of 1000° C. or higher, a hot wall type heat treatment apparatus having a function of increasing or decreasing the substrate temperature at an ultrahigh speed was used. FIG. 3 is a schematic diagram showing an example of the heat treatment apparatus used in this embodiment. The heat treatment apparatus shown in FIG. 3 is of a single-wafer type in which a substrate, for example, silicon substrate 1, is loaded in or unloaded from the heat treatment unit 2.

In this heat treatment apparatus, a heat treatment unit 2 is formed so that the upper surface and lateral surfaces are heated by a heat source provided on the outer side of the unit. The heat treatment unit has inside an atmosphere of water vapor obtained by combustion of oxygen and hydrogen, or by vaporizing water. Further, the heat treatment unit 2 and a standby unit 3 are separated by a gate valve 4. The heat treatment unit 2 includes a quartz pipe 21 and a soaking pipe 22 provided within. A gas supplying pipe 23 is provided for the quartz pipe 21, and a gas exhaustion pipe 24 is provided for the soaking pipe 22. Further, a heater 25 is provided on the outer side of the heat treatment unit 2.

The heat treatment apparatus is operated in the following manner. That is, in order to start the thermal oxidation process, the gate valve 4 is opened, and at the same time, the silicon substrate 1 is inserted into the heat treatment unit 2. When the thermal oxidation process is finished, the silicon substrate 1 is taken out from the heat treatment unit 2 to the standby unit 3, where the substrate is cooled down. The standby unit 3 has an atmosphere of an inert gas, for example, $N_2$ gas, or a rare gas such as Ar, He or Ne.

Figure 4:
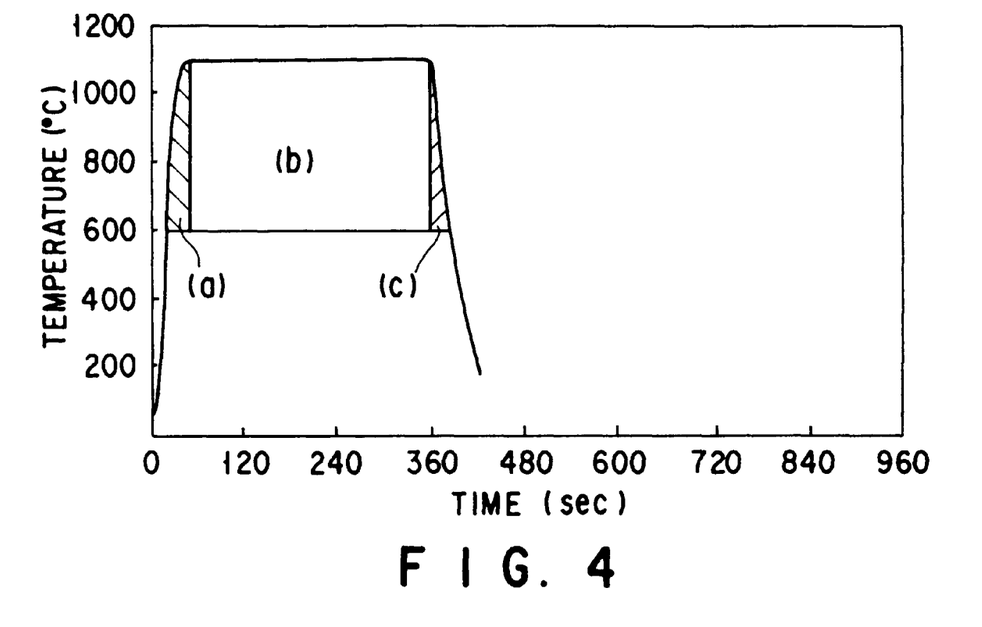
FIG. 4 is a diagram illustrating the change in temperature of the silicon substrate along with time, in the forming method of the present invention.
Figure 5:
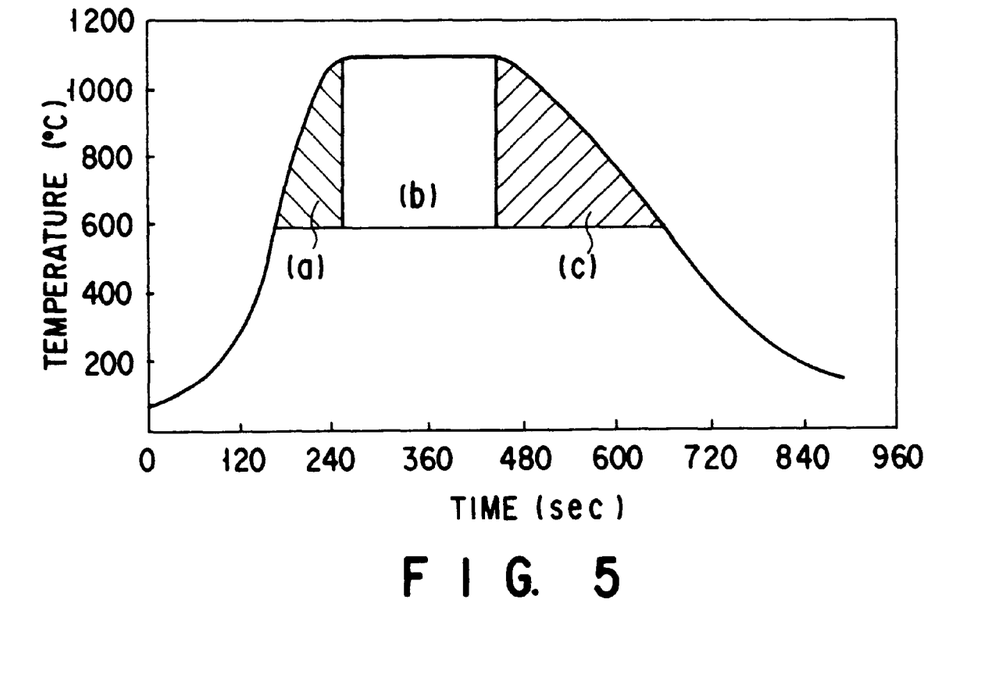
FIG. 5 is a diagram illustrating the change in temperature of the silicon substrate along with time, in the conventional forming method.

FIG. 4 is a diagram illustrating a change in the temperature of the silicon substrate along with time, in the forming method according to the present invention, whereas FIG. 5 is a diagram illustrating a change in the temperature of the silicon substrate along with time, in the conventional forming method. In both of FIGS. 4 and 5, the area (a) indicates a thermal budget required to increase from a temperature close to 600° C. or higher to a temperature close to a set temperature. It is preferable that a substrate should be loaded in a water vapor atmosphere maintained at a temperature of 900° C. or higher, and heated at a maximum temperature increasing rate of 25° C./sec or more. With such a heating method, the surface of the silicon substrate 6 can be uniformly oxidized. In the same figures, the area (b) indicates a thermal budget required while the temperature is maintained close to the set level, and the area (c) indicates a thermal budget required to decrease the temperature from the set level to a level close to 600° C. In this example, the silicon substrate was loaded from a water vapor atmosphere maintained at 900° C. or higher, into an inert gas atmosphere, thus the substrate was cooled down to 600° C. at a maximum temperature decreasing rate of 15° C./sec or more. The reason why the reference temperature was set to 600° C. here is that a temperature of 600° C. is a low temperature limit for that a silicon substrate is not substantially thermal-oxidized during a practical processing time. Therefore, in the actual case, the temperature of the silicon substrate was increased from a temperature of 600° C. or less.

It was found from the experiments carried out by the inventors that the quality of the thermal oxide film formed in the high temperature area (indicated the area b in FIG. 4) and the quality of the thermal oxide film formed during a temperature decreasing process (indicated by the area c in FIG. 4) are significantly related to the electrical characteristics of the tunnel oxide film. In other words, it was found that when there are a large amount of the thermal oxide film formed within a high temperature region, and a small amount of the thermal oxide film formed during the temperature decreasing process, such a film is appropriate as a tunnel oxide film.

Therefore, as a profile obtained through the increase-maintenance-decrease of the temperature, what is shown in FIG. 4 is preferable to that of FIG. 5. In order to achieve such a temperature profile, it is necessary to provide a step of cooling the silicon substrate from the set temperature for the process down to 600° C. at a maximum temperature decreasing rate of 15° C./sec or more. In this case, it is preferable that the above-described inert gas atmosphere should be employed. With this step, the amount of the low temperature oxide film formed on the interface side of the silicon substrate can be decreased. Further, it is necessary to provide a step of heating the silicon substrate up to the set temperature for the process at a maximum temperature increasing rate of 25° C. or more. With this step, the amount of the low temperature oxide film formed while the temperature is increasing, can be decreased. As a result, a high temperature water vapor oxide film having a high quality can be formed at high efficiency.

Next, with reference to FIGS. 6 to 9, the results of the comparison between the insulating film of the present invention and the conventional insulating film in terms of reliability, will now be described. It should be noted that the samples used were planer capacitors each having a phosphor-added polysilicon electrode, and the insulating films of these capacitors were formed on the silicon substrates grown by the Czochralski method under different oxidizing conditions.

Figure 6:
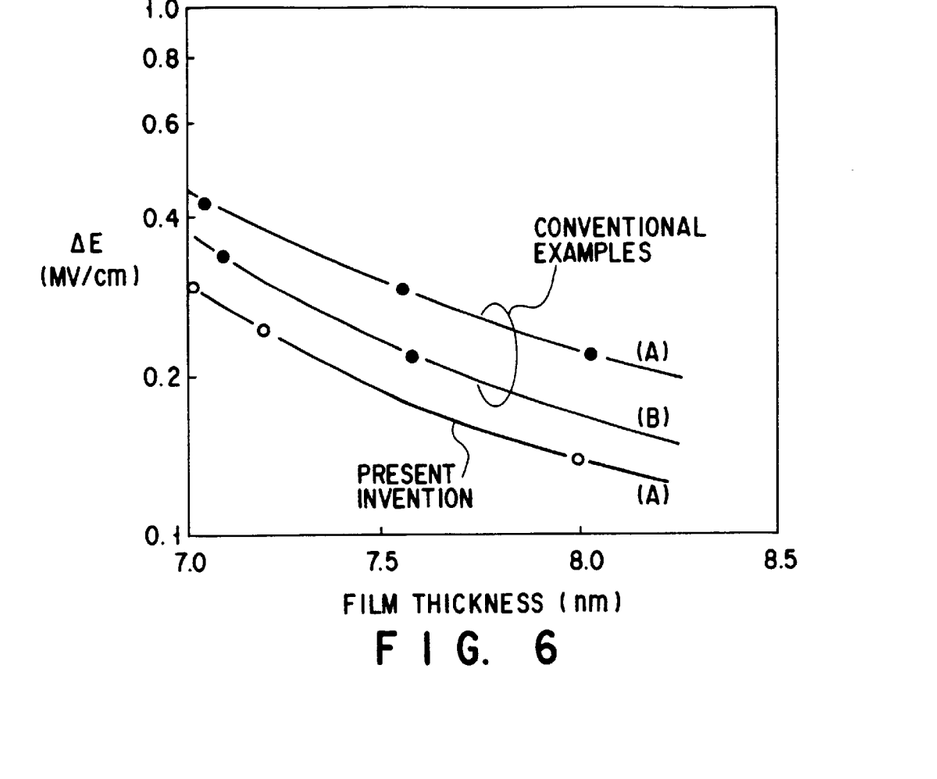
FIG. 6 is a characteristic diagram illustrating a change in the stress leak amount (ΔE) with respect to the thickness of the film.

FIG. 6 is a characteristic diagram showing the dependency of the stress leak current on the film thickness. The stress leak current indicates a leak current of a low electric field, which is created after a current stress of a high electric field is applied to an oxide film. The stress leak current was evaluated on the basis of the amount of shift (ΔE) of the electrical field with respect to the current density ($1\times10^{-7}$ $A/cm^2$) of the current density—the electrical filed characteristics (J–E characteristics) obtained before and after a constant current stress was applied to the capacitor of each sample.

As can be understood from FIG. 6, the conventional example (A) was a dry oxide film formed by oxidizing operations carried out at two different temperatures of 1000° C. and 1100° C., and exhibited no difference in ΔE valve. Further, the conventional example (B) was a wet oxide film formed at 800° C. by the conventional method, and in this example, the AE value could be decreased to about 90% of that of the dry oxide film, and the stress leak was thus suppressed. The present invention (A) was a high temperature wet oxide film formed at 1000° C. in a water vapor atmosphere of a dilution rate of 5%, by the forming method of the present invention, and the ΔE value was decreased to about 70% of that of the dry oxide film.

From the above-described results, it was found that in the dry oxide film, there was no substantial temperature dependency of the stress leak current observed, whereas in the wet oxide film, there was a temperature dependency of the stress leak current observed.

Figure 7:
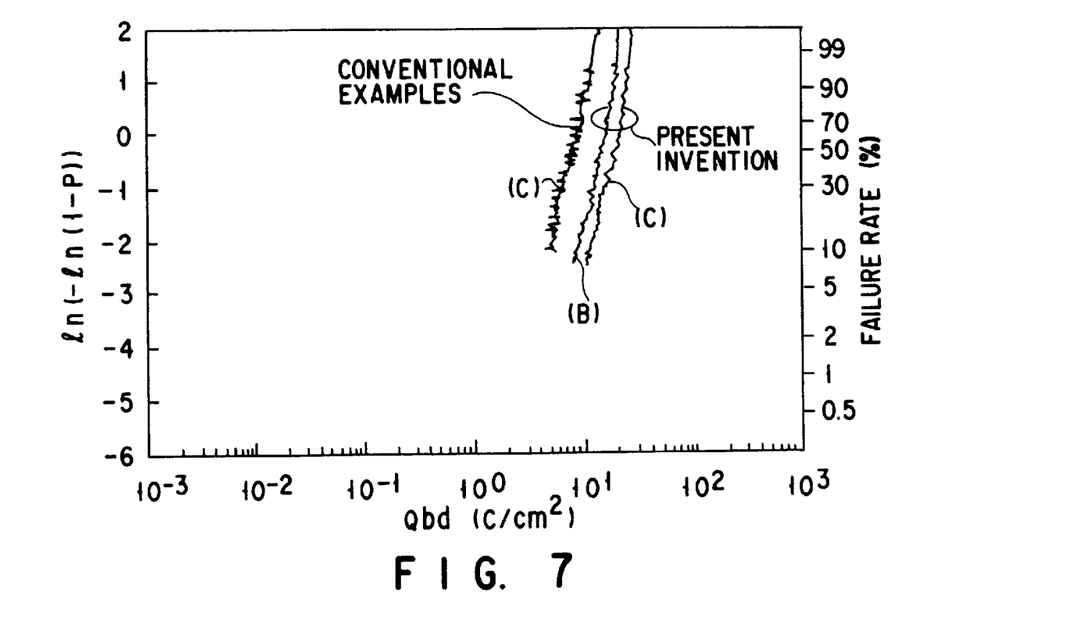
FIG. 7 is a diagram illustrating the abrasion breakage life evaluated by a constant current TDDB measurement.

FIG. 7 is a characteristic diagram showing the results of the evaluation of the abrasion breakage life (Qbd), obtained by a constant current TDDB measurement. In FIG. 7, the correlation between Qbd and an accumulated failure rate is illustrated in a Weibull plot fashion. In this figure, the conventional example (C) indicates a dry oxide film formed at 1000° C., the present invention (B) indicates a high-temperature wet oxide film formed at 900° C., and the present invention (C) is a high-temperature wet oxide film formed at 900° C. in a water vapor atmosphere in which water vapor was diluted by an inert gas (for example, argon gas) to about 1%.

As is clear from FIG. 7, the Qbd value is higher in the case of the high-temperature wet oxide film of the present invention (B) than the case of the dry oxide film of the conventional example (C). Further, of the high-temperature wet oxide films both formed at 900° C., the Qbd value can be further increased in the case of the present invention (C) which was formed in a water vapor atmosphere diluted with the inert gas.

Figure 8:
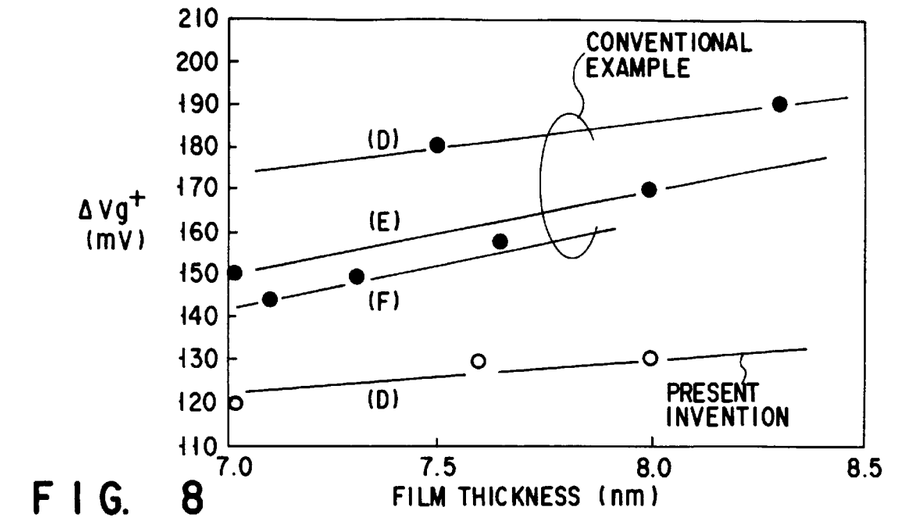
FIG. 8 is a characteristic diagram showing a change in the amount of charge trap (ΔVg+) with respect to the thickness of the film.
Figure 9:
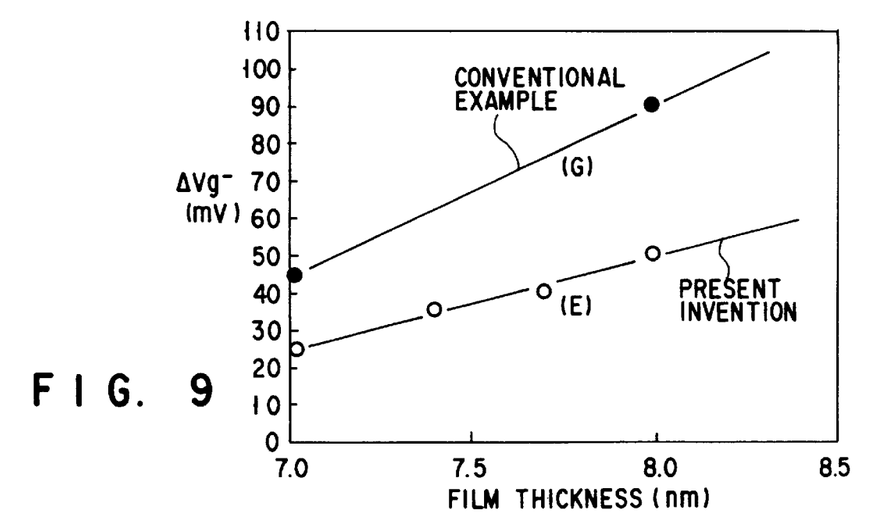
FIG. 9 is a characteristic diagram showing a change in the amount of charge trap (ΔVg−) with respect to the thickness of the film.

FIGS. 8 and 9 are characteristic diagrams each showing the dependency of the amount of charge trapped, upon the thickness of a film. It should be noted that the change (ΔVg) in gate voltage, resulting when a constant current stress was applied to the capacitor, was titled as the amount of charge trapped. Further, the stress current density was set to $-100$ mA/cm$^2$, ΔVg+ was a value obtained by subtracting the minimum Vg value from the initial value at the application of the stress, and ΔVg– was a value obtained by subtracting the minimum Vg value from the value after the application of the stress for 20 seconds. In FIG. 8, the conventional example (D) indicates a dry oxide film formed at 1100° C., the conventional example (E) indicates a dry oxide film formed at 1000° C., the conventional example (F) indicates a wet oxide film formed at 800° C., and the present invention (D) is a wet oxide film formed at 900° C. or higher.

As can be understood from the result of ΔVg+ in FIG. 8, as regards the wet oxide films of the same type, the behavior of the occurrence of the charge trap differs from one to another, depending upon oxidizing temperature, and therefore there is a large difference in the ΔVg+ value between the case of an oxidizing temperature of 800° C. or lower (the conventional example (F)), and the case of an oxidizing temperature of 900° C. or higher (the present invention (D)). In other words, in the high-temperature wet oxide film of the present invention (D), the ΔVg+ value could be reduced to about 70 to 80% of those of the conventional dry oxide films (the conventional examples (D) and (E)) and the conventional wet oxide film (the conventional example (F)).

In contrast, FIG. 9 illustrates the characteristics of the conventional example (G), which is a dry oxide film formed at 1000° C., and the present invention (E), which is a high-temperature wet oxide film formed at 1000° C. As can be understood from FIG. 9, the ΔVg– value was lower in the case of the high-temperature wet oxide film of the present invention than in the conventional dry oxide film.

Therefore, it was found from FIGS. 8 and 9 that the reduction of the amount of charge trapped could be achieved by the high-temperature wet oxide film of the present invention.

It was revealed in the above-described studies conducted by the inventors that in the case where a wet-oxidization is carried out at a high temperature of 900° C. or higher, it is preferable that a substrate should be cooled from the set temperature for the thermal oxidation process to a temperature close to 600° C. at a maximum temperature decreasing rate of 15° C./sec or more, more preferably, 20° C. or more. Further, in order to increase the amount of the oxide film formed within a high temperature region of 900° C. or higher, the maximum temperature increasing rate should be raised even to 25° C./sec or more.

Figure 10:
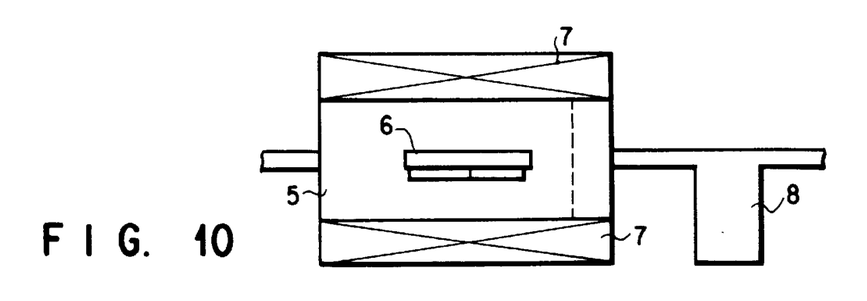
FIG. 10 is a schematic diagram showing a thermal processing apparatus used in the forming method of the present invention.

Next, another example of the forming method of the present invention will now be described. FIG. 10 is a schematic diagram showing an example of the heat treatment apparatus used in this example of the forming method of the present invention.

In the figure, reference numeral 5 denotes a chamber made of quartz. In the chamber 5, a silicon substrate 6 is placed. Further, a lamp heater 7 is arranged outside of the chamber 5, i.e. the upper and lower side of the chamber 5. A water vapor generating apparatus 8 which serves to control the partial pressure of the water vapor during a heat treatment, is connected to the chamber 5 via a pipe.

With use of the heat treatment apparatus having the above-described structure, the heat treatment is carried out in the following manner. That is, the chamber 5 is preheated to a temperature of 100 to 600° C. in advance by a lamp heater 7, so as to create, within the chamber 5, a water vapor atmosphere which is diluted by an inert gas as a carrier gas. By this heating method, the surface portion of the silicon substrate 6 can be uniformly oxidized.

The actual procedure of the introduction of gas is as follows. The atmosphere of only the carrier gas is created before the temperatures of the chamber 5 and the silicon substrate 6 do not reach the set range, and when the temperatures reach the range, the carrier gas is allowed to flow to the water vapor generating apparatus 8 located outside, and water vapor is introduced along with the carrier gas into the chamber 5, thus creating a diluted water vapor atmosphere. It should be noted that the partial pressure of the water vapor is controlled by the water vapor generating apparatus 8 and the temperature is controlled so that dewing of a water drop does not occur between the water vapor generating apparatus 8 and the chamber 5.

Next, after creating the diluted water vapor atmosphere, the silicon substrate 6 is heated up to a thermal oxidation treatment temperature of 900° C. or more at a maximum temperature increasing rate of 25° C./sec. While the temperature is maintained, a thermal oxidation treatment is carried out. When the thermal oxidation treatment is finished, the heating by the lamp heater 7 is stopped, and the temperature of the silicon substrate 6 is decreased to 600° C. or less at a maximum temperature decreasing rate of 15° C./sec or more. After that, the introduction of water vapor is stopped, and the diluted water vapor atmosphere is changed to that of only the inert gas. Then, the temperature is further decreased to 100° C. or less, and the silicon substrate 6 is unloaded from the chamber 5.

A high-temperature wet oxide film thus obtained was confirmed to have a long dielectric breakage life, a reduced amount of charge trapped, and a remarkably reduced amount of the stress leak amount.

Figure 11:
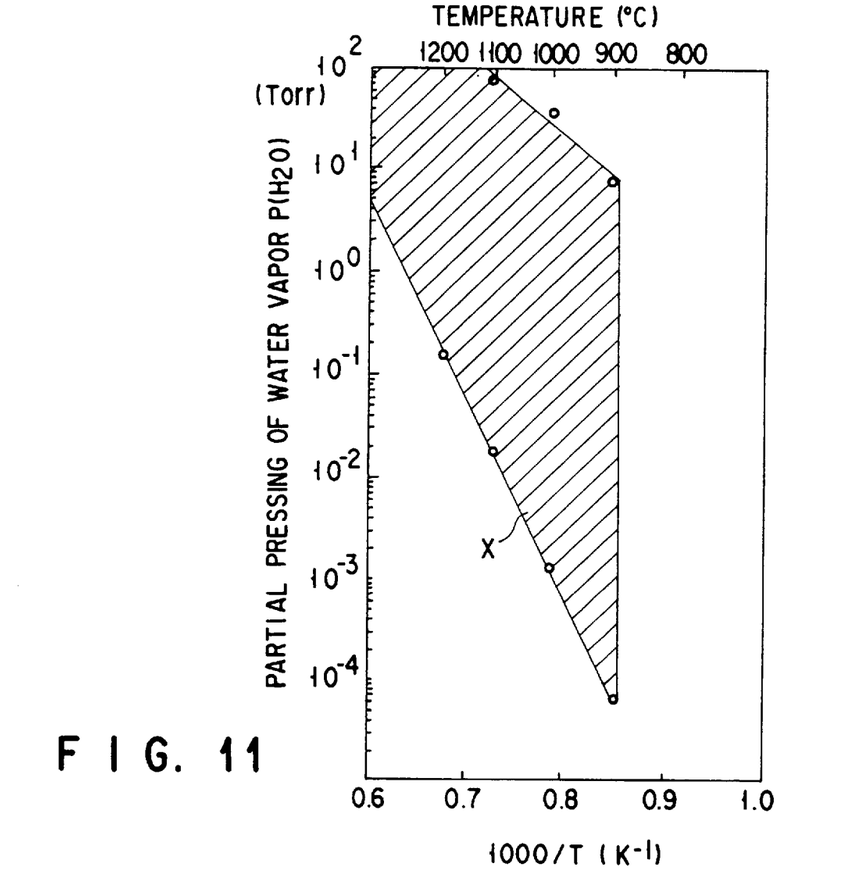
FIG. 11 is a diagram showing a range of the water vapor partial pressure (water vapor concentration) set in the forming method of the present invention.

It was further confirmed from the studies conducted by the inventors that the characteristics of the insulating film of the present invention have a strong correlation with the water vapor pressure (the concentration of water vapor) in particular, other than the above-described production processing conditions, namely, the temperature increasing and decreasing rates. As can be seen in FIG. 11, in the area shaded with oblique lines, that is, the area which satisfies the condition of a high-temperature water vapor atmosphere of 900° C. or higher, and the conditions in which the water vapor partial pressure is about 90 ppb to about 1% for a temperature of 900° C., the water vapor partial pressure is about 1 ppm to about 5% for a temperature of 1000° C., and the water vapor partial pressure is about 20 ppm to about 10% for a temperature of 1100° C., it was found that the three reliabilities (dielectric breakage life, the amount of charge trapped and the amount of stress leak) of an insulating film (tunnel oxide film) could be remarkably improved. Therefore, another feature of the present invention is that the insulating film (tunnel oxide film) is formed under the condition set within a water vapor partial pressure range (the shaded area). It should be noted that as the gas used for diluting the water vapor atmosphere employed in the oxidizing process at a high temperature, an inert gas such as argon gas or helium gas should preferably used. The reason why nitrogen is excluded is that with use of nitrogen, a substrate is nitrated at a high temperature of 1000° C. Further, even within the above shaded area, the characteristics of the insulating film can be improved by setting the water vapor atmosphere conditions of a high temperature and a high dilution. In the shaded area, the lower limit is not particularly set, but the condition with which a silicon substrate is not etched, is set as a lower limit for the sake of convenience (indicated by line X in FIG. 11).

In the case of diluting the water vapor atmosphere, it is not necessary to carry out the dilution at atmospheric pressure, and it may be carried out at a reduced pressure. When the dilution is performed at a reduced pressure, the reduced pressure state should be adjusted so as to correspond to the conditions of the case of the atmospheric pressure.

Figure 12A:
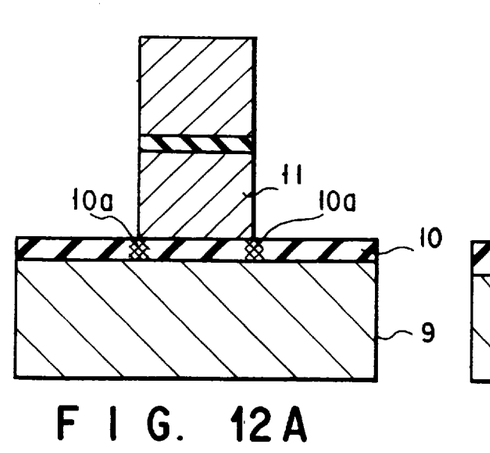
FIGS. 12A and 12B are cross sectional views each designed to describe a problem which may arises during the formation of an insulating film.
Figure 12B:
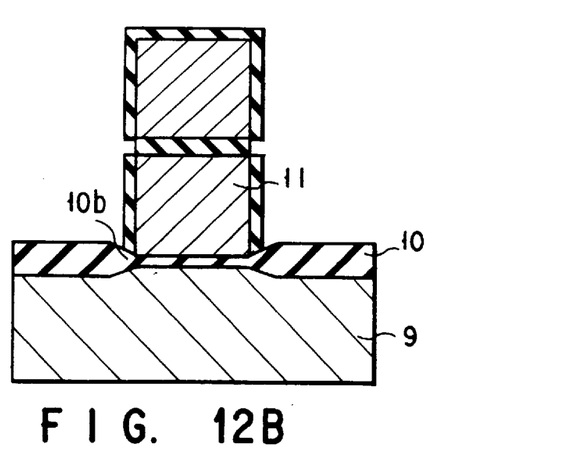

Next, the following is a description of another example of the case where the forming method of the insulating film of the present invention is applied to a so-called post-oxidation process, in which the regions directly underneath the gate edges of the tunnel oxide film as shown in FIG. 12A are re-oxidized. FIG. 12A shows the structure of a semiconductor device before a post-oxidation. In this structure, a tunnel oxide film 10 serving as an insulating film is formed on a silicon substrate 9, and a polysilicon film is formed thereon, followed by patterning which is carried out in the manner of reactive ion etching or the like, thus forming a gate electrode 11. In the areas 10a directly underneath the gate edges of the tunnel oxide film 10, the surface of the tunnel oxide film 10 becomes exposed by the etching. If a device having the above-described structure is post-oxidized by the conventional dry oxidizing method, the regions 10a directly underneath the gate edge of the tunnel oxide film 10 are re-oxidized, and therefore the thickness of the tunnel oxide film 10 is increased, thus forming a gate bird's beak 10b, as shown in FIG. 12B.

When the gate bird's beak 10b is formed by dry oxidation in the regions directly underneath the gate edges of the tunnel oxide film 10, a dry oxide film, which causes a deterioration in the characteristics, is formed in a part of the tunnel oxide film 10 as can be seen in FIGS. 6 to 9, thereby reducing the reliabilities of the tunnel oxide film 10. In order to avoid the formation of such a gate bird's beak, for the prevention of the lowering the reliability of the tunnel oxide film 10 and the maintenance of the good characteristics, it is preferable that the forming method of the present invention should be applied in the tunnel oxide film formation process and also in the post-oxidation process, where a part of the gate edge region is thermally oxidized.

Figure 13:
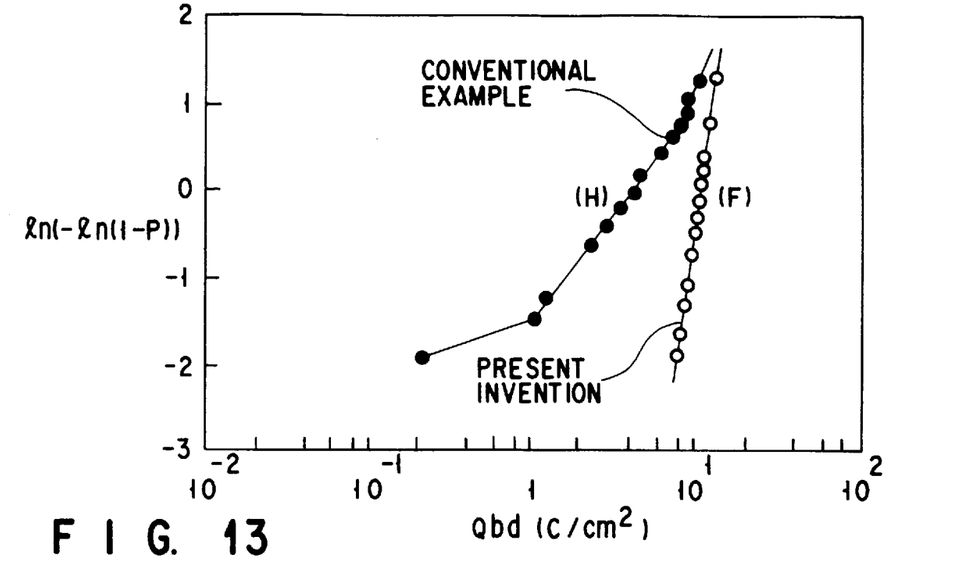
FIG. 13 is a diagram illustrating the abrasion breakage life evaluated by a constant current TDDB measurement.

FIG. 13 shows the effect of the case where the forming method of the present invention is applied also to the post-oxidation process, where a part of the gate edge region is formed. FIG. 13 is a diagram showing the accumulated failure rate of the dielectric breakage life in the form of Weibull plot, for each of a MOS capacitor gate insulating film (the present invention (F)) manufactured by applying the method of the present invention to both of the gate oxidation process and the post-oxidation process, and another MOS capacitor gate insulating film (the conventional example (H)) formed by applying the method of the present invention to the gate oxidation, and the conventional dry oxidation to the post-oxidizing process. As can be understood from FIG. 13, in the present invention (F), accidental failures were not observed, whereas in the conventional example (H) obtained by the post-oxidation of the dry oxidizing method, there were some capacitors accidentally damaged. This is because in the conventional example (H), the gate insulating film is a dry oxide film, and therefore the structure of such a film is greatly distorted as can be seen in FIG. 1B. Therefore, the number of the gate insulating films containing accidental failures increases.

Next, another example of the case where the method of forming an insulating film according to the present invention is applied to the post-oxidizing process for an ordinary EEPROM as shown in FIGS. 14A to 14D.

Figure 14A:
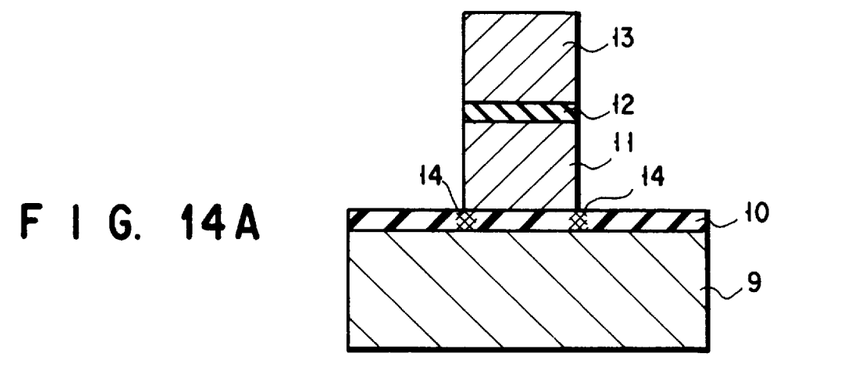
FIGS. 14A, 14B, 14C, and 14D are cross sectional views each designed to describe a problem which may arises during the formation of an insulating film.
Figure 14B:
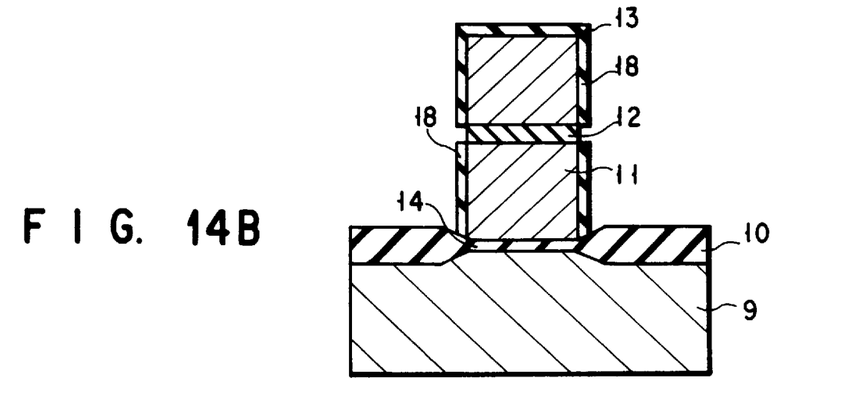
Figure 14C:
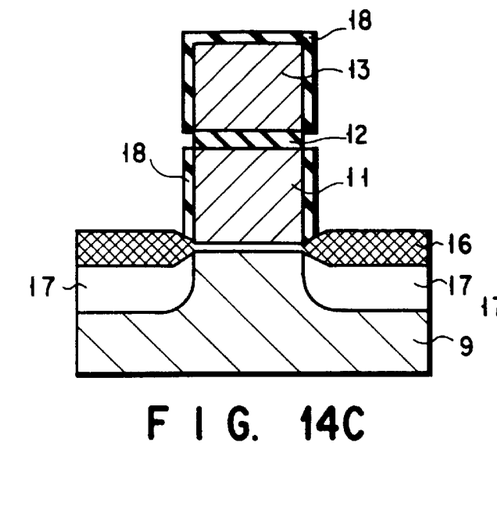
Figure 14D:
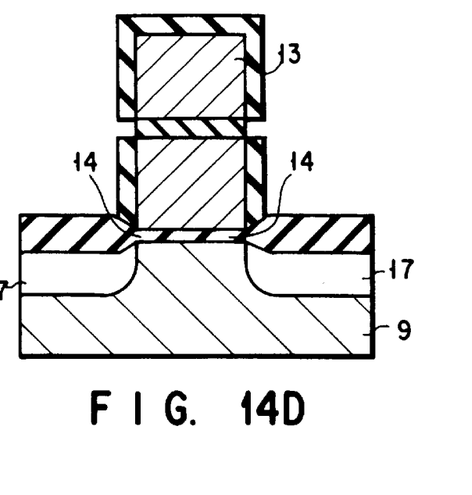

FIG. 14A shows the structure of a semiconductor device before the post-oxidation. This structure is made by the following manner. That is, a tunnel oxide film 10 serving as an insulating film is formed on a silicon substrate 9, and a polysilicon film serving as a floating gate 11, an ONO film 12 serving as an interlayer insulating film and a polysilicon film serving as a control gate 13 are formed thereon in the order, followed by a fine patterning which is carried out in the fashion of reactive ion etching or the like. FIG. 14B shows a structure obtained by thermally oxidizing the regions 14 directly underneath the gate edges after a post-oxidation once. In this figure, reference numeral 18 denotes each of silicon oxide films formed on the floating gate 11 and the control gate 13. FIG. 14C shows the structure in which, for example, As ion is implanted to form a source/drain region 17 of the transistor. In the figure, reference numeral 16 denotes a damaged portion of the oxide film by the ion implantation. FIG. 14D shows the structure of a transistor obtained after the second post-oxidizing process of the present invention after the ion implantation. More specifically, as can be seen in FIG. 14D, the substrate 9 and the electrode 11 are oxidized by the post-oxidation in the regions 14 directly underneath the gate edges and in the damaged portion 16; therefore the insulating film of the present invention is formed again on the substrate and the electrode interface.

In the case where the insulating film forming method of the present invention is applied to the formation of the gate insulating film of a transistor and the post-oxidizing process, the insulating film of the present invention can reduce the trap generating amount of electrons and holes in the oxide film and the interface between the oxide film and the substrate, and also it can suppress the variance of the threshold value of the transistor and the gm deterioration, which may be caused by the hot carriers injection.

Figure 15:
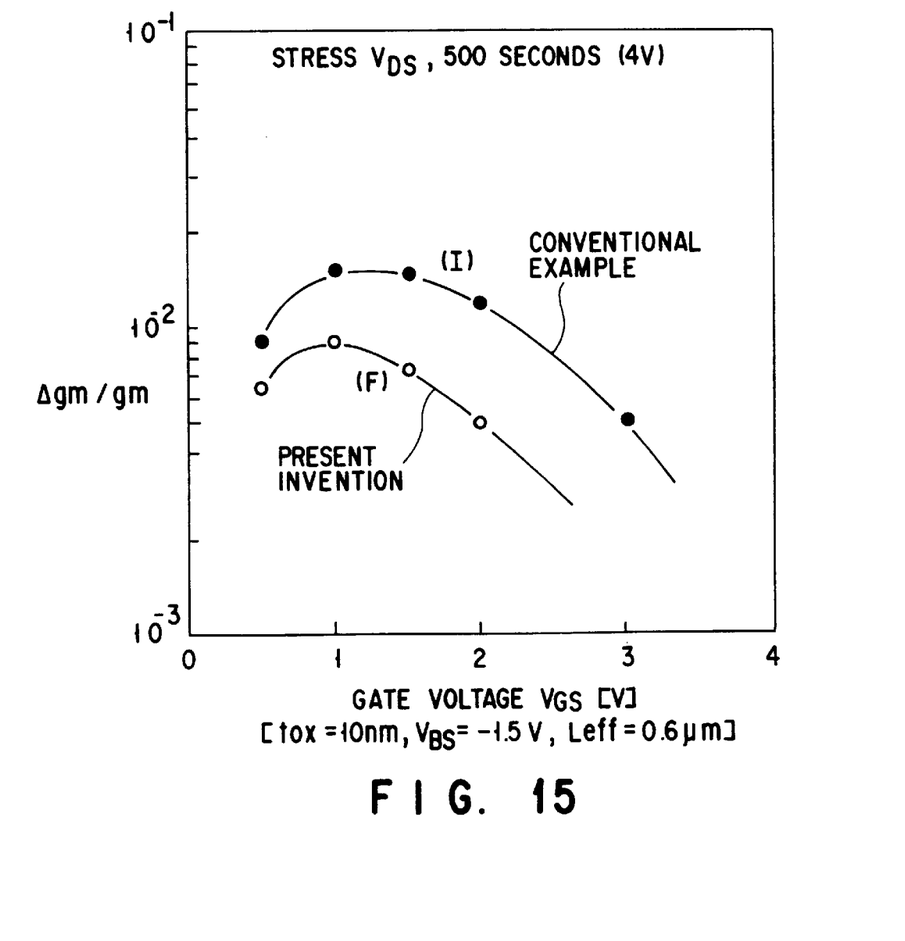
FIG. 15 is a characteristic diagram showing the relationship between a gate voltage and the gm deterioration.

FIG. 15 illustrates a comparison in terms of the gm deterioration behavior caused by the hot carriers injection, between two types of transistors, one being formed by applying the method of the present invention to the formation of the gate insulating film of the transistor, and the conventional dry oxidizing method to the post-oxidizing process (the conventional example (I), and the other one being formed by applying the present invention method to the formation of the gate insulating film and also to the post-oxidizing process. As can be understood from FIG. 15, in the transistor formed by the gate insulating film formation method of the present invention, the deterioration of gm can be suppressed to about 50% of that in the transistor formed by the conventional insulating film forming method. Therefore, in the present invention, the hot carrier resistance can be improved twice as high as that of the conventional method.

It should be noted that the description of this embodiment is directed to the case where the insulating film is formed by a thermal oxidizing process, but the present invention can be applied also to the case where an insulating film is formed by a chemical vapor deposition method (CVD). Further, the insulating film of the present invention can be formed also by combining the thermal oxidizing process and the CVD method. More specifically, the present invention can be used as a heat anneal process, where the increase in film thickness is about 1 nm or less and a thermal oxidation does not substantially proceed, other than the case where the invention is used as a thermal oxidizing process for practically forming a thermal oxide film having a thickness of 10 nm or less. In other words, the present invention can be employed as a densifying annealing process for an insulating film formed by the CVD method.

Further, the description of the present embodiment is directed to the example where a silicon oxide film is used as the insulating film, but the present invention can be applied also to the case where a silicon oxynitride film as the insulating film. In this case also, in order to suppress the adverse affects of the stress leak which is sensitive to the state of the vicinity of the interface, and the amount of charge trapped, the vicinity of the interface should be treated so that it becomes a wet oxide film. That is, in the case where a silicon oxynitride insulating film is formed by an RTN (Rapid Thermal Nitridation) ($NH_3$ treatment) and an RTO (Rapid Thermal Oxidation) (oxidizing treatment), the wet oxidizing method of the present invention should be used in the RTO step, in order to obtain the effect of the present invention. In this case, it is preferable that the oxidizing rate of the wet oxidizing step of the present invention should be set in accordance with the oxidizing rate of the ordinary RTO step.

Furthermore, the description of the embodiment is directed to the wet oxidizing process which is carried out in a water vapor atmosphere, but the present invention can be applied to a wet oxidizing process in an oxyhydrogen atmosphere, in which water vapor generated by the combustion of oxygen and hydrogen.

Furthermore, the present invention can be applied to a post-oxidizing process carried out after processing the gate electrode, other than the gate insulating film between a silicon substrate and a gate electrode, or the tunnel insulating film between a silicon substrate and a floating gate in an EEPROM.

The present invention can be remodeled into a variety of versions apart from those discussed in the above, as long as the essence of the present invention remains unchanged.

As described above, the insulating film of the present invention exhibits the effects as follows: a long dielectric breakage life, a reduced amount of charge trapped, and a remarkably reduced amount of stress leak even for a thin insulating film having a thickness of 10 nm or less. Further, according to the present invention method of forming an insulating film, it is able to provide an insulating film which satisfies the above characteristics at the same time.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An insulating film, on a surface of a substrate, comprising oxygen and silicon, wherein an oxygen 1s photoelectronic spectral peak of a portion of said insulating film 1 nm from the surface of said substrate is the sum of:

a first peak having a half width of 1.208 eV and a peak position corresponding to the oxygen 1s peak of an α-quartz crystal charge corrected with a is peak of carbon adsorbed on a surface of said α-quartz crystal, a second, third, and fourth peaks, each having a peak position +0.87 eV, −0.35 eV and −0.83 eV, respectively, from said first peak;

wherein said oxygen 1s photoelectronic spectral peak of said portion of said insulating film is measured at a photoelectron extracting angle of 15° or less, said oxygen 1s photoelectronic spectral peak of said portion of said insulating film is charge corrected with a 1s peak of carbon adsorbed on a surface of said insulating film, and a relative peak area of sail first, said second, said third and said fourth peaks are 40% or more, 20% or less, 30% or less, and 20% or less, respectively, of the area of said oxygen 1s photoelectronic spectral peak of said portion of said insulating film.

2. An insulating film according to claim 1, wherein said substrate is made of one selected from the group consisting of monocrystal silicon, polysilicon and amorphous silicon.

3. An insulating film according to claim 1, wherein said insulating film is one selected from the group consisting of a gate insulating film, a tunnel insulating film formed between said substrate and a floating gate, and an insulating film in a gate bird's beak region.

4. The insulating film of claim 1, wherein said film has a thickness of 3–10 nm.

5. The insulating film of claim 2, wherein said film has a thickness of 3–10 nm.

6. The insulating film of claim 3, wherein said film has a thickness of 3–10 nm.

7. The insulating film of claim 1, wherein said substrate is selected from the group consisting of a silicon substrate, a substrate having a silicon surface film and an epitaxial silicon substrate.

8. The insulating film of claim 2, wherein said substrate is selected from the group consisting of a silicon substrate, a substrate having a silicon surface film and an epitaxial silicon substrate.

9. The insulating film of claim 3, wherein said substrate is selected from the group consisting of a silicon substrate, a substrate having a silicon surface film and an epitaxial silicon substrate.

10. The insulating film of claim 1, wherein said insulating film is silicon oxide.

11. The insulating film of claim 2, wherein said insulating film is silicon oxide.

12. The insulating film of claim 3, wherein said insulating film is silicon oxide.

13. The insulating film of claim 1, wherein said insulating film is silicon oxynitride.

14. The insulating film of claim 2, wherein said insulating film is silicon oxynitride.

15. The insulating film of claim 3, wherein said insulating film is silicon oxynitride.

16. The insulating film of claim 1, wherein said substrate is a silicon on insulator substrate.

17. The insulating film of claim 2, wherein said substrate is a silicon on insulator substrate.

18. The insulating film of claim 3, wherein said substrate is a silicon on insulator substrate.

19. The insulating film of claim 16, wherein said insulating film is silicon oxide.

20. The insulating film of claim 19, wherein said insulating film has a thickness of 3–10 nm.

* * * * *

UNITED STATES PATENT AND TRADEMARK OFFICE
CERTIFICATE OF CORRECTION

PATENT NO. : 5,959,329

DATED : September 28, 1999

INVENTOR(S): Hiroshi TOMITA, et al.

It is certified that an error appears in the above-identified patent and that said Letters Patent is hereby corrected as shown below:

On the title page, item [30] should be:

--[30]   Foreign Application Priority Data
    Sep. 19, 1995  [JP]  Japan  ............... 7-240003
    Mar. 18, 1996  [JP]  Japan  ............... 8-061140--

Signed and Sealed this

Twenty-seventh Day of June, 2000

Attest:

Q. TODD DICKINSON

*Attesting Officer*  *Director of Patents and Trademarks*